(12) United States Patent
Iwata

(10) Patent No.: US 9,848,264 B2
(45) Date of Patent: Dec. 19, 2017

(54) AUDIO SIGNAL AMPLIFICATION DEVICE

(71) Applicant: Panasonic Intellectual Property Management Co., Ltd., Osaka (JP)

(72) Inventor: Kazuya Iwata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/206,274

(22) Filed: Jul. 10, 2016

(65) Prior Publication Data

US 2016/0323669 A1 Nov. 3, 2016

Related U.S. Application Data

(63) Continuation of application No. PCT/JP2014/005914, filed on Nov. 26, 2014.

(30) Foreign Application Priority Data

Feb. 18, 2014 (JP) ................................ 2014-028088

(51) Int. Cl.
*H03F 3/217* (2006.01)
*H04R 3/04* (2006.01)
(Continued)

(52) U.S. Cl.
CPC ............ *H04R 3/04* (2013.01); *G10L 21/0208* (2013.01); *H03F 1/34* (2013.01); *H03F 3/183* (2013.01);
(Continued)

(58) Field of Classification Search
CPC ...................................... H03F 3/217
(Continued)

(56) References Cited

U.S. PATENT DOCUMENTS

2004/0051654 A1 3/2004 Ohkuri et al.
2006/0208794 A1 9/2006 Morishima
(Continued)

FOREIGN PATENT DOCUMENTS

JP 2002-159088 5/2002
JP 2003-133959 5/2003
(Continued)

OTHER PUBLICATIONS

International Search Report of PCT application No. PCT/JP2014/005914 dated Feb. 17, 2015.
(Continued)

*Primary Examiner* — Khanh V Nguyen
*Assistant Examiner* — Khiem Nguyen
(74) *Attorney, Agent, or Firm* — McDermott Will & Emery LLP

(57) ABSTRACT

An audio signal amplification device of the disclosure includes: a delta-sigma modulation part configured to resample an input digital audio signal with a quantization number smaller than a quantization number of the digital audio signal; a pulse-width modulation part configured to convert an output signal from the delta-sigma modulation part into a pulse-width modulation signal which sets a gradation of the output signal in an amplitude direction at a gradation of a pulse width; a power amplification part configured to perform power amplification on an output signal from the pulse-width modulation part; a low-pass filter configured to diminish a component higher than a predetermined cutoff frequency, in an output signal from the power amplification part, and to output the resultant signal; and a correction processing part configured to generate a correction signal for correcting the digital audio signal. The correction processing part includes a switch configured to control coupling of the correction processing part to the
(Continued)

low-pass filter. When the switch is on, the correction processing part couples a loudspeaker to the low-pass filter, and generates the correction signal.

4 Claims, 10 Drawing Sheets

(51) Int. Cl.
   *H03F 1/34* (2006.01)
   *G10L 21/0208* (2013.01)
   *H03F 3/183* (2006.01)
(52) U.S. Cl.
   CPC .......... *H03F 3/217* (2013.01); *H03F 3/2175* (2013.01); *H03F 3/2171* (2013.01); *H03F 3/2173* (2013.01); *H03F 2200/03* (2013.01); *H03F 2200/171* (2013.01); *H03F 2200/331* (2013.01); *H03F 2200/351* (2013.01); *H03F 2200/432* (2013.01)

(58) Field of Classification Search
   USPC ........................................ 330/10, 251, 207 A
   See application file for complete search history.

(56) References Cited

U.S. PATENT DOCUMENTS

2009/0190651 A1    7/2009  Yoneya
2011/0080217 A1*   4/2011  Lee .......................... H03F 1/30
                                                              330/277

FOREIGN PATENT DOCUMENTS

JP      2006-121529      5/2006
WO      2008/012904      1/2008

OTHER PUBLICATIONS

The Extended European Search Report dated Jan. 26, 2017 for the related European Patent Application No. 14883059.9.

* cited by examiner

AUDIO SIGNAL AMPLIFICATION DEVICE

BACKGROUND

1. Technical Field

The disclosure relates to an audio signal amplification device.

2. Description of Related Art

With regard to a scheme for enhancing the efficiency of a power amplifier, for example, WO 2008/012904 A1 discloses a class-D power amplifier as a signal amplification device.

SUMMARY

The disclosure provides an audio signal amplification device that achieves improved sound quality of an audio signal.

An audio signal amplification device of the disclosure includes: a delta-sigma modulation part configured to resample an input digital audio signal with a quantization number smaller than a quantization number of the digital audio signal; a pulse-width modulation part configured to convert an output signal from the delta-sigma modulation part into a pulse-width modulation signal which sets a gradation of the output signal in an amplitude direction at a gradation of a pulse width; a power amplification part configured to perform power amplification on an output signal from the pulse-width modulation part; a low-pass filter configured to diminish a component higher than a predetermined cutoff frequency, in an output signal from the power amplification part, and to output the resultant signal; and a correction processing part configured to generate a correction signal for correcting the digital audio signal. The correction processing part includes a switch configured to control coupling of the correction processing part to the low-pass filter. When the switch is on, the correction processing part couples a loudspeaker to the low-pass filter, and generates the correction signal.

The audio signal amplification device of the disclosure is capable of achieving improved sound quality.

DESCRIPTION OF EMBODIMENTS

Figure 1:
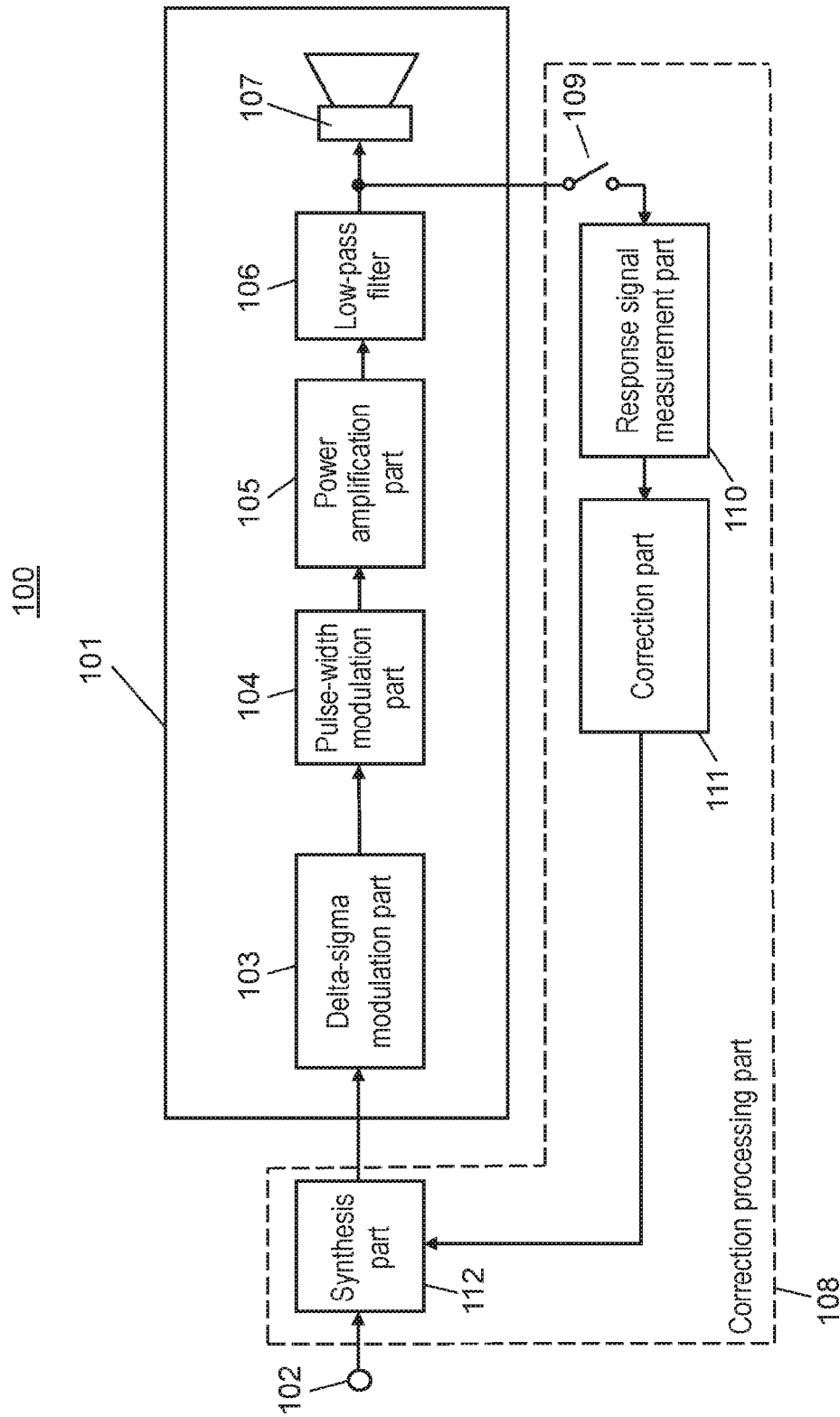
FIG. 1 is a block diagram of an audio signal amplification device in a first exemplary embodiment.

Exemplary embodiments will be described in detail below while referring to the drawings as appropriate. However, a description to be specific more than necessary will not be given occasionally. For example, a specific description of a well-known matter and a repetitive description of substantially identical constituents will not be given occasionally. This makes a person skilled in the art understand the disclosure with ease since the following description is not redundant more than necessary.

The attached drawings and the following description are merely provided for making a person skilled in the art satisfactorily understand the disclosure, and therefore do not intend to limit a subject matter described in the claims.

First Exemplary Embodiment

[1-1. Technical Challenge]

Figure 7:
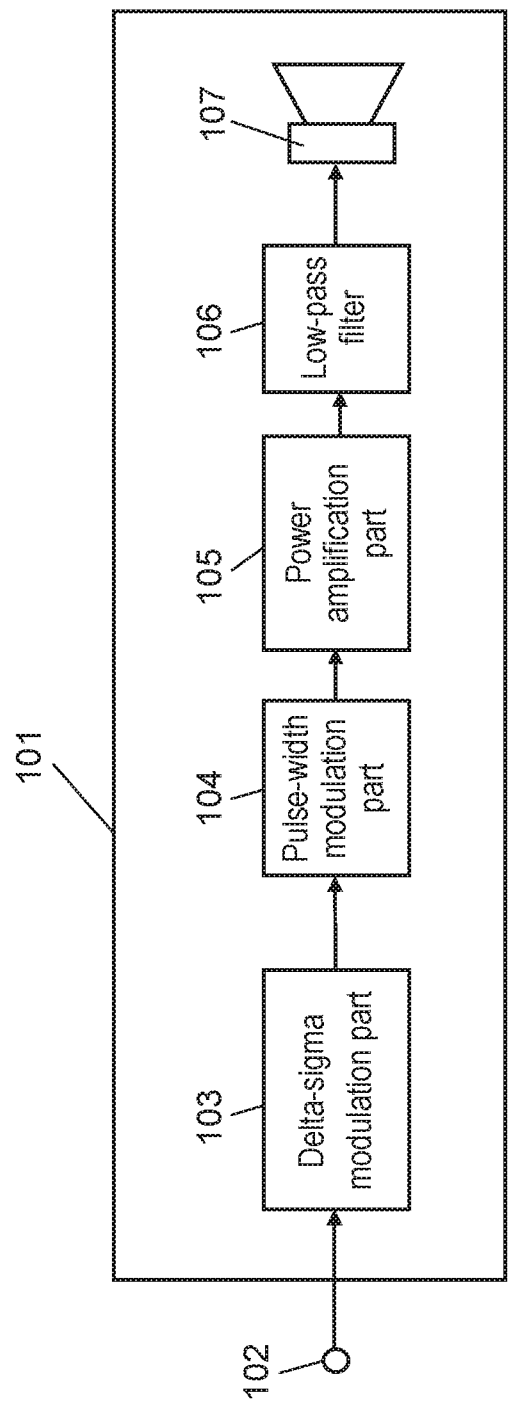
FIG. 7 is a block diagram of a conventional class-D power amplifier.

First, a description will be given of a technical challenge of an audio signal amplification device for improving sound quality. FIG. 7 is a block diagram of a conventional class-D power amplifier that receives a digital audio signal. Class-D power amplifier 101 receives a digital signal from input terminal 102. Class-D power amplifier 101 includes delta-sigma modulation part 103, pulse-width modulation part 104, power amplification part 105, low-pass filter 106, and loudspeaker 107.

Delta-sigma modulation part 103 secures a dynamic range determined from a quantization number of the digital signal received from input terminal 102, within a predetermined band, for example, up to an audible band of 20 kHz, and then reduces the quantization number.

Pulse-width modulation part 104 converts, into a pulse width, a gradation of an output signal from delta-sigma modulation part 103 in an amplitude direction.

Power amplification part 105 performs power amplification on a binary signal output from pulse-width modulation part 104.

Low-pass filter 106 removes a carrier signal generated in pulse-width modulation part 104 and requantization noise generated in delta-sigma modulation part 103, from an output from power amplification part 105 to extract an audio signal. Low-pass filter 106 includes a coil and a capacitor in order to reduce a power loss.

Class-D power amplifier 101 configured as described above converts the audio signal received from input terminal 102, into the binary signal and amplifies the signal amplitude to almost a power supply voltage. This configuration minimizes a power loss in an amplification element and achieves high power efficiency.

Figure 8:
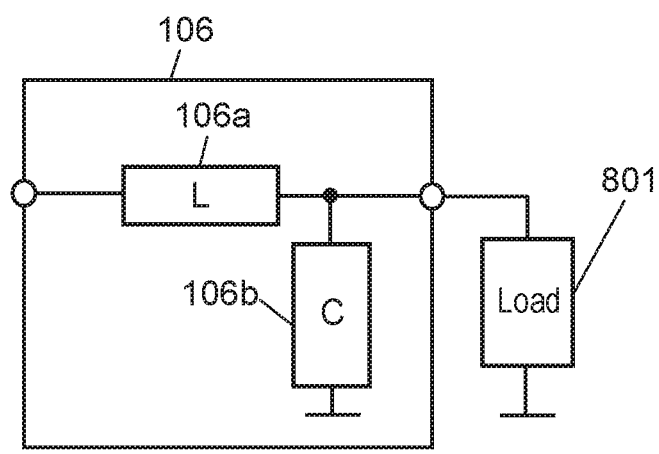
FIG. 8 illustrates a technical challenge of a frequency characteristic of the low-pass filter.
Figure 9A:
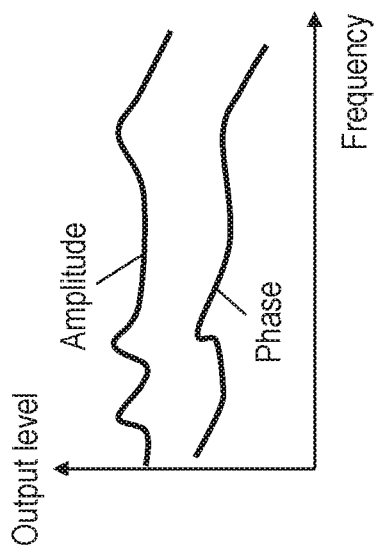
FIG. 9A illustrates a frequency characteristic of the low-pass filter to which a load of pure resistance is coupled as a load.
Figure 9B:
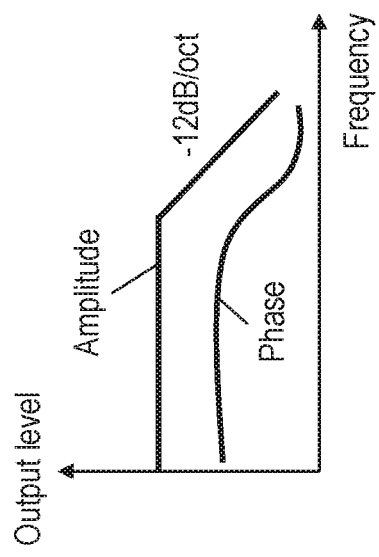
FIG. 9B illustrates a frequency characteristic of the low-pass filter to which a loudspeaker is coupled as the load.
Figure 10:
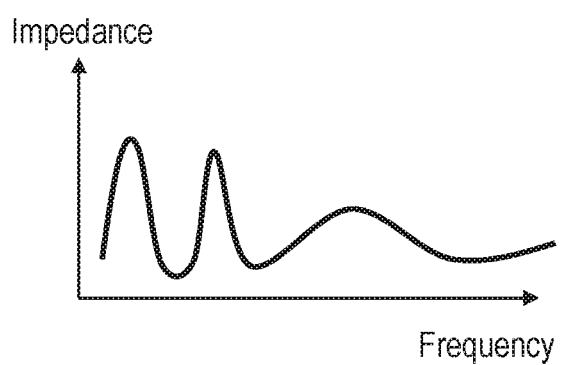
FIG. 10 illustrates an impedance relative to a frequency of an output signal from the loudspeaker.

FIG. 8 illustrates a technical challenge of a frequency characteristic of low-pass filter 106. Referring to FIG. 8, low-pass filter 106 includes coil 106a and capacitor 106b. Low-pass filter 106 has an output terminal to which load 801 is coupled. FIG. 9A illustrates a frequency characteristic of low-pass filter 106 to which a load of pure resistance is coupled as load 801. FIG. 9B illustrates a frequency characteristic of low-pass filter 106 to which loudspeaker 107 is coupled as load 801. In FIGS. 9A and 9B, the horizontal axis indicates a frequency of an output signal from low-pass filter 106, and the longitudinal axis indicates an output level of a frequency-amplitude characteristic and an output level of a frequency-phase characteristic. Low-pass filter 106 is designed to have the frequency-amplitude characteristic and the frequency-phase characteristic each illustrated in FIG. 9A. FIG. 10 illustrates an impedance relative to a frequency of an output signal from loudspeaker 107. Loudspeaker 107 has an impedance, that is, a resistance value which varies in accordance with a frequency as illustrated in FIG. 10. Therefore, when loudspeaker 107 is coupled as load 801 to low-pass filter 106, the output from low-pass filter 106 has the frequency characteristic illustrated in FIG. 9B. Therefore, even when low-pass filter 106 is designed to have the frequency characteristic illustrated in FIG. 9A, low-pass filter 106, to which loudspeaker 107 is coupled, has the frequency characteristic illustrated in FIG. 9B which is significantly different from the frequency characteristic illustrated in FIG. 9A.

As described above, low-pass filter 106, to which loudspeaker 107 is coupled, fails to have a desired characteristic, so that the sound quality of loudspeaker 107 is degraded.

Figure 11:
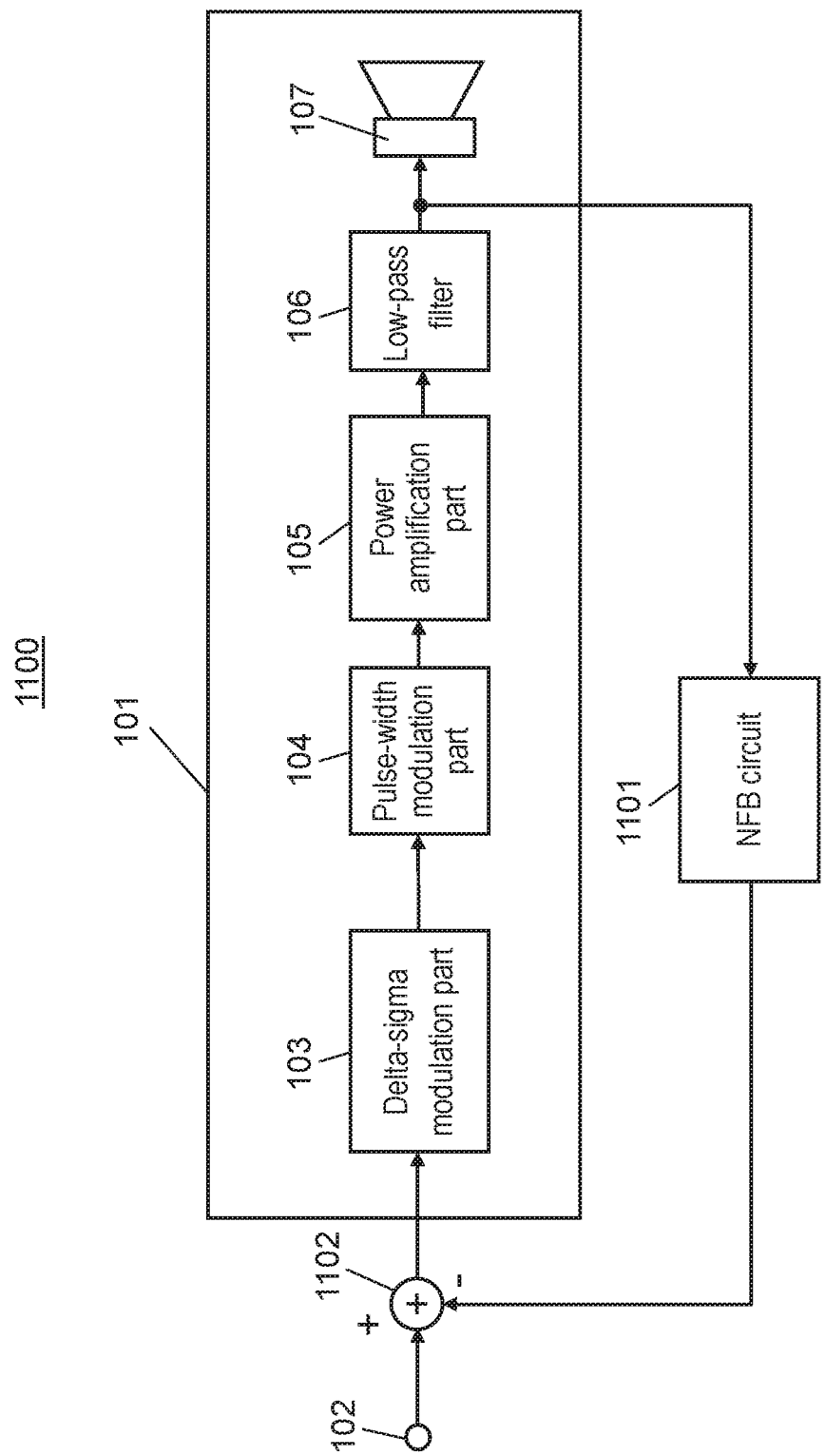
FIG. 11 is a block diagram of a conventional audio signal amplification device.

FIG. 11 is a block diagram of a conventional audio signal amplification device. Audio signal amplification device 1100 includes input terminal 102, class-D power amplifier 101, NFB (Negative FeedBack) circuit 1101, and adder 1102. NFB circuit 1101 negatively feeds an output signal from low-pass filter 106 back to adder 1102. According to this negative feedback, a difference between an input signal from input terminal 102 and the signal subjected to the negative feedback is obtained by adder 1102, is amplified, and then is input to class-D power amplifier 101 again.

According to the configuration that NFB circuit 1101 always performs negative feedback, audio signal amplification device 1100 suppresses distortion generated in low-pass filter 106.

When a gain of adder 1102 becomes not less than 1, that is, not less than 0 dB at a frequency where a phase shift amount between the input signal from input terminal 102 and the output signal from NFB circuit 1101 becomes not less than 180 degrees, NFB circuit 1101 performs positive feedback rather than negative feedback, so that the output from low-pass filter 106 oscillates abnormally in some cases. In order to overcome this disadvantage, it is known as a condition for stable negative feedback that a phase margin is set to be not less than 60 degrees and a gain margin is set to be not less than 6 dB. The phase margin indicates that how much the phase difference at the frequency where the gain is 0 dB exceeds 0 degree, that is, 180 degrees in terms of the phase shift amount. The gain margin indicates how much the gain at the frequency where the phase difference is 0 degree falls below 0 dB.

As described above with reference to FIG. 10, however, the amplitude and phase of loudspeaker 107 to be coupled vary depending on the variations in the frequency. Furthermore, combinations of the variations in the amplitude with the variations in the phase differ for each type of loudspeaker 107 to be coupled. Therefore, it is difficult to satisfy the condition for stable negative feedback.

In addition, audio signal amplification device 1100 requires an A/D converter for class-D power amplifier 101 in order to perform negative feedback on an error which currently occurs, using a digital signal. The A/D converter causes time delay based on operation thereof, and this time delay leads to incorrect negative feedback. Moreover, even when audio signal amplification device 1100 successfully performs the negative feedback, audio signal amplification device 1100 is incapable of correcting distortion due to the phase generated in low-pass filter 106.

Accordingly, the audio signal amplification device that utilizes class-D power amplification is incapable of deriving the inherent characteristic of the loudspeaker because of the above phenomenon. In other words, the audio signal amplification device has a technical challenge that sound quality is degraded.

[1-2. Audio Signal Amplification Device]

FIG. 1 is a block diagram of audio signal amplification device 100 in a first exemplary embodiment. Audio signal amplification device 100 includes input terminal 102, class-D power amplifier 101, and correction processing part 108. Correction processing part 108 includes switch 109, response signal measurement part 110, correction part 111, and synthesis part 112.

Audio signal amplification device 100 receives a digital audio signal through input terminal 102.

Correction processing part 108 performs processing of generating a correction signal (which will be described later) only in a state in which switch 109 is on. For example, switch 109 is turned on before first use of audio signal amplification device 100 by a user. Switch 109 is turned off after completion of the processing by correction processing part 108.

Audio signal amplification device 100 is provided with a button (not illustrated) that allows the user to turn switch 109 on. The button has a lamp. The lamp goes on during the ON state of switch 109, and goes out when switch 109 is turned off. The lamp allows the user to visually recognize the state of the switch.

Response signal measurement part 110 measures a frequency-amplitude characteristic and a frequency-phase characteristic of class-D power amplifier 101.

Correction part 111 generates a correction signal for correcting the frequency-amplitude characteristic and frequency-phase characteristic of class-D power amplifier 101, based on a result of the measurement by response signal measurement part 110.

Synthesis part 112 stores the generated correction signal therein, and corrects a frequency-amplitude characteristic and a frequency-phase characteristic of a digital audio signal corresponding to an input signal from input terminal 102, based on the stored correction signal.

Next, a specific description will be given of each constituent of audio signal amplification device 100.

[1-2. Class-D Power Amplifier]

First, a description will be given of class-D power amplifier 101. Class-D power amplifier 101 converts an input digital audio signal, for example, a 16-bit digital audio signal in a case of a compact disc, into a 1-bit binary signal. Then class-D power amplifier 101 performs power amplification on the binary signal, and removes a component in an unnecessary band from the binary signal in low-pass filter 106 to extract the audio signal subjected to the power amplification.

Figure 2:
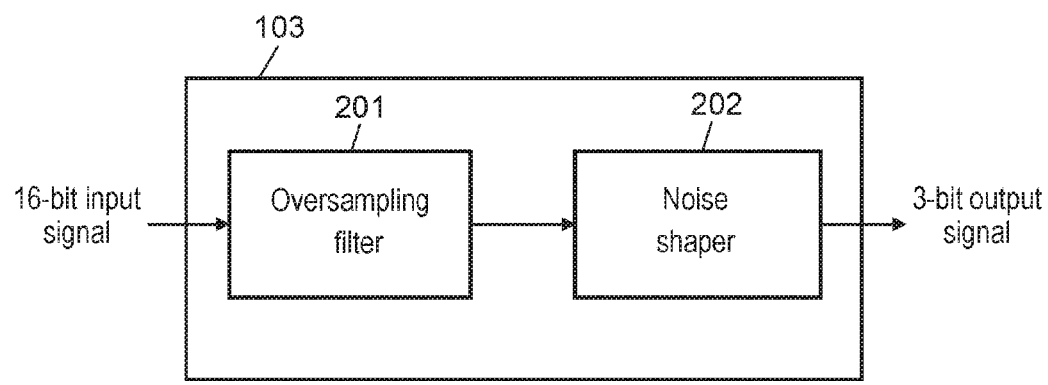
FIG. 2 is a block diagram of a delta-sigma modulation part in the first exemplary embodiment.

Delta-sigma modulation part 103 requantizes a digital audio signal received from input terminal 102. FIG. 2 is a block diagram of delta-sigma modulation part 103. Delta-sigma modulation part 103 includes oversampling filter 201 and noise shaper 202. In FIG. 2, an input signal is of 16 bits and an output signal is of 3 bits.

However, a combination of the input signal with the output signal is not limited to that described above. For example, the input signal may be of M bits (M: an integer of not less than 1) and the output signal may be of N bits (N: an integer that satisfies M>N and is greater than 1). Typically, a specific value of M is 16, 20, or 24.

Oversampling filter 201 multiplies a sampling frequency of the digital audio signal corresponding to the input signal by the power of 2, and removes an alias component from the signal.

Figure 3:
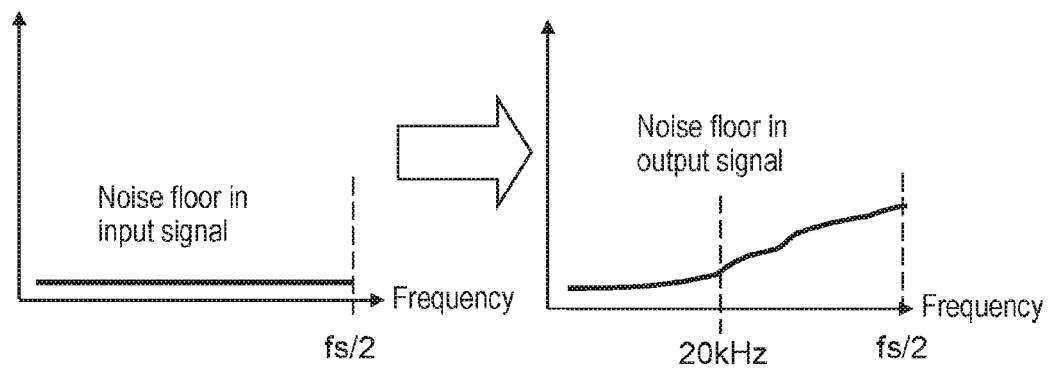
FIG. 3 illustrates a characteristic of a noise floor in an input signal and a characteristic of a noise floor in an output signal, with regard to a noise shaper in the first exemplary embodiment.

Noise shaper 202 requantizes the oversampled digital audio signal by a quantization number smaller than that of the input signal. Noise shaper 202 reduces requantization noise generated at the time of requantization, that is, a noise floor in an audio band of, for example, not more than 20 kHz. FIG. 3 illustrates a characteristic of a noise floor in the input signal and a characteristic of a noise floor in the output signal, with regard to noise shaper 202. In FIG. 3, the left side shows the characteristic of the noise floor in the input signal of noise shaper 202, and the right side shows the characteristic of the noise floor in the output signal of noise shaper 202. Moreover, the horizontal axis indicates a frequency of the signal, and the longitudinal axis indicates an output level of the noise floor. It is apparent from FIG. 3 that the noise floor in the input signal is stable, but the noise floor in the output signal is relatively low in an audio band of not more than 20 kHz and is relatively high in an audio band exceeding 20 kHz.

Pulse-width modulation part 104 converts the output signal from delta-sigma modulation part 103 into a pulse-width modulation signal to set a gradation of the output signal in an amplitude direction at a gradation of a pulse width.

Specifically, the 16-bit input signal is converted into a binary pulse-width modulation signal through the processing by delta-sigma modulation part 103 and the processing by pulse-width modulation part 104.

Power amplification part 105 performs power amplification on the amplitude of the pulse-width modulation signal. Power amplification part 105 amplifies the received binary signal to almost a power supply voltage and reduces a reactive voltage, thereby suppressing a power loss.

Low-pass filter 106 removes a component in an unnecessary band from the binary signal, which is subjected to the power amplification, to extract a signal in an audio band.

In order to suppress a power loss, low-pass filter 106 includes coil 106a and capacitor 106b as illustrated in FIG. 8. A characteristic of low-pass filter 106, for example, a Butterworth characteristic is determined on the assumption that a load of pure resistance is coupled as load 801 to an output terminal of low-pass filter 106. Typically, this characteristic is designed such that a flat characteristic is attenuated in a passband and a carrier wave of pulse-width modulation part 104 or requantization noise generated in delta-sigma modulation part 103 is attenuated in a cutoff band.

[1-3. Correction Processing Part]

Next, a description will be given of correction processing part 108. Correction processing part 108 performs processing of generating a correction signal only in a state in which switch 109 is on.

Correction processing part 108 measures an output signal from low-pass filter 106 to which loudspeaker 107 is coupled. A measurement signal is input to input terminal 102 in the state in which loudspeaker 107 is coupled to low-pass filter 106. A signal to be used as the measurement signal is a TSP (Time Stretched Pulse) signal having a broadband frequency characteristic.

Examples of the measurement signal may include an impulse signal and other signals in addition to the TSP signal. A measurement range falls within a predetermined audio band, for example, not more than 20 kHz.

[1-3-1. Response Signal Measurement Part]

Response signal measurement part 110 measures the output signal from low-pass filter 106 in accordance with the received measurement signal. Response signal measurement part 110 measures an impulse response of class-D power amplifier 101. Response signal measurement part 110 performs FFT (Fast Fourier Transform) processing on the measured output signal to obtain the frequency-amplitude characteristic and frequency-phase characteristic of class-D power amplifier 101. The TSP signal corresponds to a signal of which the frequency is scanned (swept) fast from a low-frequency band to a high-frequency band in a frequency range where a sine wave having a phase proportional to the square of the frequency is subjected to measurement. The TSP signal is higher in energy than a single pulse signal. Therefore, when the output signal is subjected to synchronous addition by multiple times, a large S/N (Signal-Noise) ratio is obtained with ease. Response signal measurement part 110 calculates the impulse response from the measured output signal, by inverse function analysis.

[1-3-2. Correction Part (Generation of Correction Signal for Frequency-Amplitude Characteristic)]

Correction part 111 calculates a ratio between the frequency-amplitude characteristic obtained by response signal measurement part 110 and a target frequency-amplitude characteristic for audio signal amplification device 100. Correction part 111 calculates a correction signal for the frequency-amplitude characteristic from this ratio.

The calculation of the correction signal by correction part 111 is preferably determined from a balance between a correcting effect and a correction processing amount. In other words, a more enhanced correcting effect is expected from simple correction processing.

Hence, correction part 111 determines the details of correction in consideration of a subjective character of a human who visually and auditorily recognizes an audio signal. For example, correction part 111 utilizes a characteristic that a frequency characteristic felt by a human ear is geometric. In this case, correction part 111 utilizes octave band analysis, thereby enhancing a subjective effect and reducing a processing amount. Correction part 111 divides the frequency-amplitude characteristic obtained by response signal measurement part 110 by a 1/N (N: a positive integer) octave band, and calculates an average value for each divided band. Then correction part 111 calculates a value at a frequency point, which is actually subjected to the correction processing, from the calculated average value, and defines the value as a frequency-amplitude measurement value for calculating a correction signal. Likewise, correction part 111 also calculates a target frequency-amplitude characteristic value. Correction part 111 calculates the correction signal, based on a ratio between the frequency-amplitude measurement value and the target frequency-amplitude characteristic value.

As described above, in calculating the correction signal for the frequency-amplitude characteristic, correction part 111 assigns a weight to a specific octave band in consideration of, for example, results obtained from a human auditory characteristic and a unique subjective evaluation.

[1-3-3. Correction Part (Generation of Correction Signal for Frequency-Phase Characteristic)]

Response signal measurement part 110 performs FFT processing on the measured impulse response, thereby obtaining a frequency-phase characteristic. However, since a trigonometric function for use in the FFT processing has periodicity, the frequency-phase characteristic occasionally takes a discontinuous value. Response signal measurement part 110 calculates the frequency-phase characteristic in consideration of this factor. Response signal measurement part 110 calculates a phase delay characteristic by dividing the frequency-phase characteristic by an angular frequency or calculates a group delay characteristic by differentiating the frequency-phase characteristic with an angular frequency. Then response signal measurement part 110 calculates a difference between the calculated phase delay characteristic or group delay characteristic and a target phase delay characteristic or group delay characteristic for audio signal amplification device 100. Moreover, response signal measurement part 110 performs processing which is reverse in procedure to the processing of calculating the phase delay characteristic or the group delay characteristic to calculate a frequency-phase characteristic for reducing the difference between the measured value and the target value. Furthermore, response signal measurement part 110 extracts the frequency-phase characteristic at the frequency point, which is actually subjected to the correction processing, to calculate a correction signal for the frequency-phase characteristic.

[1-3-4. Synthesis Part]

Synthesis part 112 stores therein the correction signal generated by correction part 111. Synthesis part 112 synthesizes the correction signal with an input digital audio signal. The synthesis is performed by convolution operation using FIR (Finite Impulse Response). In other words, synthesis part 112 performs inverse FFT processing on the calculated correction signal to calculate an impulse response, and then convolves the resultant correction signal with the input signal.

The synthesizing method is not limited to that described above. Another synthesizing method may involve performing FFT processing on an input digital audio signal, multiplying the resultant digital audio signal by a correction signal, and performing inverse FFT processing on a result of the multiplication.

When synthesis part 112 stores the correction signal therein, audio signal amplification device 100 turns switch 109 off in correction processing part 108.

[1-4. Advantageous Effect of Correction]

Figure 4:
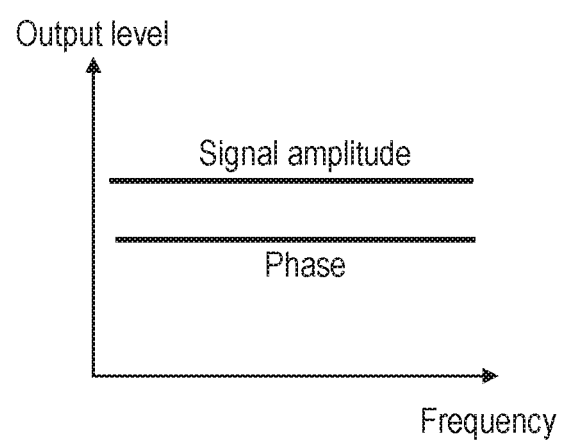
FIG. 4 illustrates a corrected frequency-amplitude characteristic and frequency-phase characteristic in the first exemplary embodiment.

FIG. 4 illustrates the corrected frequency-amplitude characteristic and frequency-phase characteristic. The frequency-amplitude characteristic and frequency-phase characteristic in FIG. 9B are corrected so as to approach the target frequency-amplitude characteristic and frequency-phase characteristic for audio signal amplification device 100 as illustrated in FIG. 4.

As described above, audio signal amplification device 100 of the disclosure includes: delta-sigma modulation part 103 configured to resample an input digital audio signal with a quantization number smaller than a quantization number of the digital audio signal; pulse-width modulation part 104 configured to convert an output signal from delta-sigma modulation part 103 into a pulse-width modulation signal to set a gradation of the output signal in an amplitude direction at a gradation of a pulse width; power amplification part 105 configured to perform power amplification on an output signal from pulse-width modulation part 104; low-pass filter 106 configured to diminish a component higher than a predetermined cutoff frequency, in an output signal from power amplification part 105, and to output the resultant signal; and correction processing part 108 configured to generate a correction signal for correcting the digital audio signal. Correction processing part 108 includes switch 109 configured to control coupling of correction processing part 108 to low-pass filter 106. When switch 109 is on, correction processing part 108 couples to the low-pass filter 106, to which a loudspeaker is coupled, and generates the correction signal.

According to this configuration, it is possible to correct an audio signal in accordance with a loudspeaker to be coupled.

In audio signal amplification device 100 of the disclosure, correction processing part 108 includes: response signal measurement part 110 configured to measure an output signal from low-pass filter 106; correction part 111 configured to generate the correction signal, based on a result of the measurement by response signal measurement part 110; and synthesis part 112 configured to synthesize the correction signal with the digital audio signal.

In audio signal amplification device 100 of the disclosure, when switch 109 is on, delta-sigma modulation part 103 receives a measurement signal having an impulse characteristic, and correction part 111 generates one of a correction signal for a frequency-amplitude characteristic and a correction signal for a frequency-phase characteristic, from the result of the measurement by response signal measurement part 110.

According to this configuration, an input digital audio signal is corrected in advance. Thus, class-D power amplifier 101 of audio signal amplification device 100 is capable of efficiently performing power amplification and supplying power to a load. Moreover, class-D power amplifier 101 is also capable of outputting an audio signal having a frequency-amplitude characteristic close to a target frequency-amplitude characteristic and a frequency-phase characteristic close to a target frequency-phase characteristic.

In the exemplary embodiment, response signal measurement part 110 measures both the frequency-amplitude characteristic and the frequency-phase characteristic of the signal output from low-pass filter 106; however, the disclosure is not limited thereto. Response signal measurement part 110 may be configured to measure one of the frequency-amplitude characteristic and frequency-phase characteristic.

In the exemplary embodiment, audio signal amplification device 100 may be configured as one module. Alternatively, class-D power amplifier 101 and correction processing part 108 may be configured as separate modules.

In the exemplary embodiment, class-D power amplifier 101 is used as a power amplifier; however, the disclosure is not limited thereto. Examples of the power amplifier may include a class-A power amplifier, a class-AB power amplifier, a class-B power amplifier, and the like.

[1-5. Cutoff Frequency of Low-Pass Filter]

Next, a description will be given of a cutoff frequency of low-pass filter 106.

Delta-sigma modulation part 103 performs processing of increasing an influence of requantization noise due to a reduction in quantization number, in a frequency range higher than an audio band as described above with reference to FIG. 3.

However, if loudspeaker 107 is coupled to low-pass filter 106, low-pass filter 106 fails to attain a target characteristic as a filter. As a result, low-pass filter 106 is incapable of satisfactorily attenuating the noise to cause degradation in sound quality in some cases.

Figure 5A:
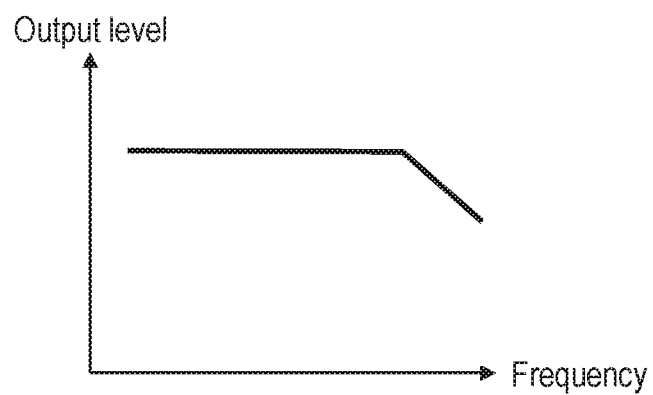
FIG. 5A illustrates a characteristic of a conventional low-pass filter.
Figure 5B:
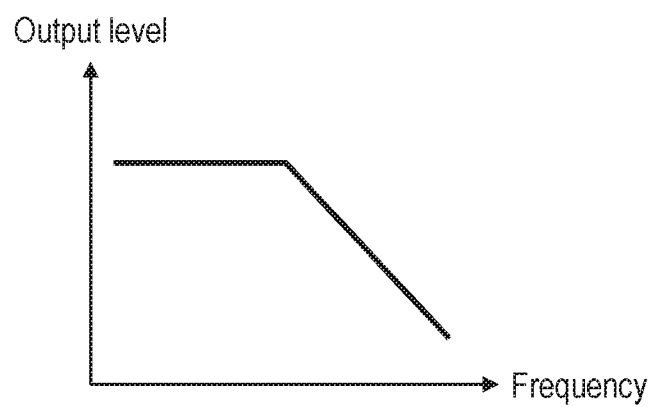
FIG. 5B illustrates a characteristic of a low-pass filter in the first exemplary embodiment.

FIG. 5A illustrates a characteristic of conventional low-pass filter 106, and FIG. 5B illustrates a characteristic of low-pass filter 106 in the exemplary embodiment. In FIGS. 5A and 5B, the horizontal axis indicates a frequency of an input signal to low-pass filter 106 and the longitudinal axis indicates an output level of low-pass filter 106. Comparing FIG. 5A with FIG. 5B, the cutoff frequency of low-pass filter 106 in FIG. 5B is lower than the cutoff frequency of low-pass filter 106 in FIG. 5A. The cutoff frequency of low-pass filter 106 refers to a frequency in a case where a gain of an output signal is lowered by a predetermined level or more with respect to an input signal at a predetermined frequency or more. When low-pass filter 106 receives the input signal at the frequency which is not less than the cutoff frequency, low-pass filter 106 outputs the signal by suppressing the signal as the frequency of the signal is higher. In other words, low-pass filter 106 diminishes the input signal at the frequency which is not less than the cutoff frequency, and then outputs the resultant signal.

Figure 6:
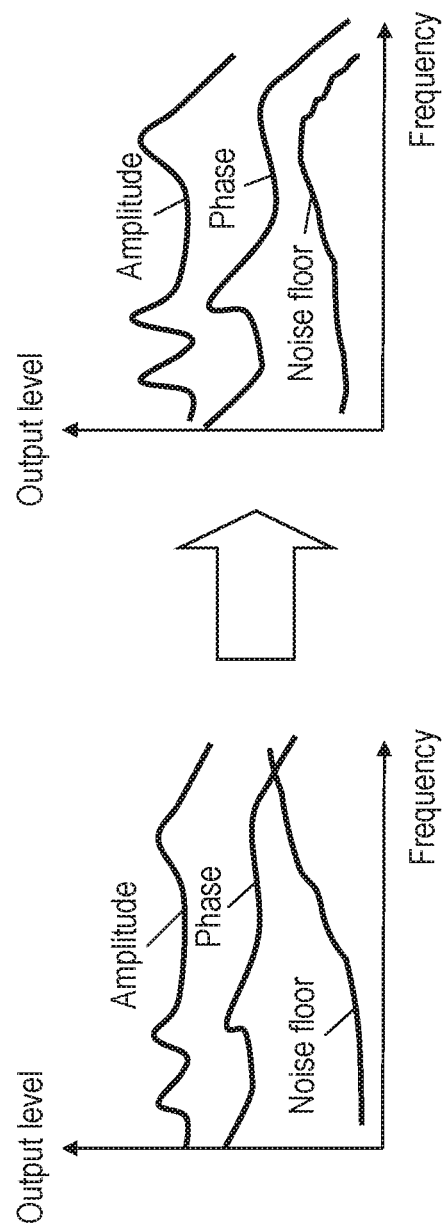
FIG. 6 illustrates a characteristic of a noise floor, a frequency-amplitude characteristic, and a frequency-phase characteristic, with regard to an output signal from the delta-sigma modulation part in the first exemplary embodiment.

FIG. 6 illustrates a characteristic of a noise floor, a frequency-amplitude characteristic, and a frequency-phase characteristic, with regard to an output signal from delta-sigma modulation part 103. In FIG. 6, the left side shows the characteristic of conventional low-pass filter 106, and the right side shows the characteristic of low-pass filter 106 in the exemplary embodiment. Moreover, the horizontal axis indicates the frequency of the output signal from low-pass filter 106, and the longitudinal axis indicates the output level of low-pass filter 106. Comparing the characteristic of conventional low-pass filter 106 with the characteristic of low-pass filter 106 in the exemplary embodiment in FIG. 6, as the frequency of the output signal from low-pass filter 106 is higher, a decline in response occurs at the frequency-amplitude characteristic, the frequency-phase characteristic, and the frequency characteristic of the noise floor, with regard to the output signal from low-pass filter 106. This leads to a reduction in requantization noise.

An audio signal amplification device of the disclosure is applicable to a sound reproducing system for which high sound quality is required.

What is claimed is:

1. An audio signal amplification device comprising:
    a delta-sigma modulation part configured to resample an input digital audio signal with a quantization number smaller than a quantization number of the digital audio signal;
    a pulse-width modulation part configured to convert an output signal from the delta-sigma modulation part into a pulse-width modulation signal which sets a gradation of the output signal in an amplitude direction at a gradation of a pulse width;
    a power amplification part configured to perform power amplification on an output signal from the pulse-width modulation part;
    a low-pass filter configured to diminish a component higher than a predetermined cutoff frequency, in an output signal from the power amplification part, and to output the resultant signal; and
    a correction processing part configured to generate a correction signal for correcting the digital audio signal by utilizing octave band analysis,
    wherein
    the correction processing part includes a switch configured to control coupling of the correction processing part to the low-pass filter, and
    when the switch is on, the correction processing part couples to the low-pass filter, and generates the correction signal.

2. The audio signal amplification device according to claim 1,
    wherein
    the correction processing part includes:
    a response signal measurement part configured to measure an output signal from the low-pass filter;
    a correction part configured to generate the correction signal, based on a result of the measurement by the response signal measurement part; and
    a synthesis part configured to synthesize the correction signal with the digital audio signal.

3. The audio signal amplification device according to claim 1,
    wherein
    when the switch is on, the delta-sigma modulation part receives a measurement signal having an impulse characteristic, and
    the correction part generates one of a correction signal for a frequency-amplitude characteristic and a correction signal for a frequency-phase characteristic, from the result of the measurement by the response signal measurement part.

4. The audio signal amplification device according to claim 1, wherein the switch is a manual switch.

* * * * *